United States Patent
André

[19]

[11] Patent Number: 6,028,486
[45] Date of Patent: Feb. 22, 2000

[54] METHOD AND APPARATUS FOR REDUCING POWER DISSIPATION IN MULTI-CARRIER AMPLIFIERS

[75] Inventor: Tore André, Älvsjö, Sweden

[73] Assignee: Telefonaktiebolaget Lm Ericsson, Stockholm, Switzerland

[21] Appl. No.: 08/946,652

[22] Filed: Oct. 7, 1997

[51] Int. Cl.[7] .................................................. H03F 3/04
[52] U.S. Cl. .............................. 330/297; 330/5; 330/295
[58] Field of Search .......................... 330/297, 51, 124 R, 330/136, 295

[56] References Cited

U.S. PATENT DOCUMENTS

| | | | |
|---|---|---|---|
| 3,793,482 | 2/1974 | Thompson | 178/73 R |
| 4,158,179 | 6/1979 | Sakai et al. | 330/297 |
| 4,401,954 | 8/1983 | Suzuki | 330/297 |
| 4,423,389 | 12/1983 | Fushiki | 330/297 |
| 4,430,625 | 2/1984 | Yokoyama | 330/297 |
| 4,472,688 | 9/1984 | Saburo et al. | 330/297 |
| 4,487,522 | 12/1984 | Fuller et al. | 307/473 |
| 4,518,928 | 5/1985 | Ishii | 330/297 |
| 4,737,732 | 4/1988 | Westwick | 330/261 |
| 4,748,423 | 5/1988 | Jinich | 330/295 |
| 5,256,987 | 10/1993 | Kibayashi et al. | 330/295 |
| 5,548,246 | 8/1996 | Yamamoto et al. | 330/51 |
| 5,644,255 | 7/1997 | Taylor | 326/81 |

FOREIGN PATENT DOCUMENTS

| | | |
|---|---|---|
| 0 080 771 | 6/1983 | European Pat. Off. . |
| 0 279 694 | 8/1988 | European Pat. Off. . |
| 2 126 456 | 3/1984 | United Kingdom . |
| 95/34128 | 12/1995 | WIPO . |

*Primary Examiner*—Robert Pascal
*Assistant Examiner*—Khanh Jan Nguyen
*Attorney, Agent, or Firm*—Nixon & Vanderhye P.C.

[57] ABSTRACT

A method and apparatus are provided for reducing power dissipated by an amplifier circuit such as a line driver in a Digital Subscriber Line (DSL), a power amplifier in a radio environment, etc. The power supplied to the amplifier circuit changes depending upon the level of input signal to the amplifier circuit. A higher power is supplied to the amplifier circuit when the level of the input signal exceeds a threshold. Otherwise, a lower power is supplied to the amplifier circuit.

12 Claims, 6 Drawing Sheets

METHOD AND APPARATUS FOR REDUCING POWER DISSIPATION IN MULTI-CARRIER AMPLIFIERS

FIELD OF THE INVENTION

The present invention relates to power dissipation in electronic devices, and more particularly, to reducing power dissipation in multi-carrier data transmission systems.

BACKGROUND AND SUMMARY OF THE INVENTION

The general principle of transmitting data by dividing it into several interleaved bit streams, and using these bit streams to modulate several carriers is well known, e.g., Discrete Multitone (DMT) and Orthogonal Frequency Division Multiplex (OFDM) modulation and demodulation systems. These types of multi-carrier modems are being used or considered for use in such applications as cellular radio and Digital Subscriber Lines (DSLs) such as High rate Digital Subscriber Lines (HDSLs), Asymmetric Digital Subscriber Lines (ADSLs), etc.

In a Discrete Multitone system, the input bit stream is first serial-to-parallel converted. The parallel output is then grouped into N groups of bits corresponding to the number of bits per symbol. Portions of bits are allocated to each DMT carrier or subchannel. The power transmitted over each subchannel is preferably approximately the same.

FIG. 1 shows an example Discrete Multitone (DMT) communication system in which the present invention may be advantageously employed. Transmitter 10 includes a serial-to-parallel converter 14, a multicarrier modulator 16, and a pretransmit processor 18. Receiver 12 includes a post channel processor 20, a multicarrier demodulator 22, and a parallel-to-serial converter 24. The transmitter and receiver are linked in this example by a digital subscriber line (DSL) or other form of communication channel 26. Serial input data at a rate of $b_{total}/T$ bits per second are grouped by converter 14 into blocks of $b_{total}$ bits for each multicarrier symbol, with a symbol period of T. The $b_{total}$ bits in each multicarrier symbol are used to modulate N separate carriers in modulator 16 with $b_i$ bits modulating the $i^{-th}$ carrier.

A preferred embodiment uses an Inverse Discrete Fourier Transform (IDFT) during modulation to generate $N_s$ time-domain samples of a transmit signal for each block of $b_{total}$ bits, where $N_s$ is preferably equal to 2N. The corresponding multicarrier demodulator performs a Discrete Fourier Transform (DFT), where $b_i$ bits are recovered from the $i^{-th}$ carrier. As depicted in FIG. 2, the carriers or subchannels in a DMT system are spaced 1/T Hz apart across N/T Hz of the frequency band. More detailed discussion of the principles of multicarrier transmission and reception in general is given by J. A. C. Bingham in "Multicarrier Modulation for Data Transmission: An Idea Whose Time Has Come", *IEEE Communications Magazine*, Volume 28, Number 5, pp. 5–14, May 1990.

In some digital subscriber link systems as well as in different radio systems where multi-carrier modulation is used, the modulation output is approximately a normal distribution. Normal distribution means that the peak-to-average ratio of the output is relatively high. Because of this high ratio, the transmitting amplifier in a multi-carrier system, (e.g., a line driver in a digital subscriber line system, a power amplifier in a radio system, etc.), must have a high supply voltage in order to adequately transmit the occasional high signal peaks without "clipping" or other distortion.

Unfortunately, such a high supply voltage results in substantial power dissipation in the line driver, power amplifier, etc. In fact, in a typical commercial, Asymmetric Digital Subscriber Line (ADSL) system, more than sixty percent of the total power is consumed in the line driver. Thus, there is a need to reduce the power dissipation in such a line driver as well as in other multicarrier modulator drivers.

To illustrate the power dissipation in a line driver, consider the DMT Digital Subscriber Line (DSL) example shown in the simplified diagram FIG. 3. A modulated multi-carrier signal is converted into analog format in a digital-to-analog converter 30 and then supplied to a line driver amplifier circuit 32 which drives the "line" 34 via a coupling transformer. A schematic representation of FIG. 3 is shown in FIG. 4 with the modulated input signal being represented as $U_{in}$. The amplified output signal $U_L$ produced by line driver 32 is supplied to a resistive load ($R_L$) 38. An amplifier voltage supply 34 includes positive and negative voltage supply "rails," i.e., the supply rails have the same magnitude but opposite polarity.

The power dissipated in the line driver 32 ($P_d$) may be characterized in accordance with the following equation:

$$P_d = (P_{SUPPLY} - U_L) * U_L / R_L + P_f \qquad (1)$$

The parameter $P_f$ is a technology dependent power that can only be reduced with new possible improvements in semiconductor technology fabrication/manufacture. Therefore, treating $P_f$ as a constant (or at least something that cannot be directly controlled), the dissipated power line driver $P_d$ may only be reduced by lowering the supply voltage $V_{supply}$.

The graph in FIG. 5 shows an example output signal from a DMT or OFDM modulation transmitter having a normal distribution. The "tails" of the normal distribution curve are quite long and correspond to a relatively high peak voltage $V_{high}$. Even though most of the "tail" indicates a very low probability of occurrence, in order to accurately generate the infrequent high magnitude voltages without clipping, the line driver requires a relatively high supply voltage.

It would be highly desirable to selectively supply a high magnitude voltage $V_{high}$ to a multi-carrier, transmit/driving device, like a line driver, for high magnitude input signals and supply a considerably lower magnitude voltage $V_{low}$ when the input signal magnitude is relatively low. If lower supply voltages were used most of the time, the overall power dissipation in the driving device would be considerably reduced.

The present invention achieves the desirable result of reduced power dissipation. In particular, an amplifier circuit receives an input signal and generates an output signal. First and second power supplies provide power at first and second levels, respectively, where the second level is greater than the first level. A controller causes power to be supplied from the first power supply to the amplifier circuit when the magnitude of the input signal is less than or equal to a predetermined threshold. When the magnitude of the input signal is greater than the threshold, the controller causes power to be supplied from the second power supply to the amplifier circuit.

In preferred example implementations of the invention, the amplifier circuit is a line driver used in a multi-carrier, DSL-type transmission system. The first power level preferably corresponds to a voltage of five volts, and the second power level preferably corresponds to a voltage of twelve volts. The controller includes a comparator which compares an amplitude of the input signal with the threshold and generates the control signal based on the comparison.

In one example embodiment of the present invention, the amplifier circuit includes a single amplifier having a power input. A switch is coupled to the first and second power supplies and to the power input of the amplifier circuit. The controller generates a control signal that controls the switch to selectively couple either of the first and second power supplies to the power input of the amplifier.

In another example embodiment, the amplifier circuit includes first and second amplifiers coupled to the input signal. The first amplifier is coupled to the first power supply and the second amplifier is coupled to the second power supply. A switch is connected to an output from each of the first and second amplifiers. The controller generates a control signal causing the switch to select the output from either of the first and second amplifiers.

Accordingly, the present invention provides a method for reducing the power dissipated by an amplifier circuit. In particular, the power supplied to the amplifier circuit is changed depending on the level of input signal to that circuit. A higher power is supplied to the amplifier circuit when the level of the input signal exceeds a threshold. Otherwise, a lower power is supplied to the amplifier circuit. The magnitude of the input signal is detected and compared with the threshold. A control signal is generated based on that comparison to control whether higher or lower power is supplied to the amplifier circuit.

DETAILED DESCRIPTION OF THE DRAWINGS

The features and advantages of the present invention outlined above are described more fully below in the detailed description in conjunction with the drawings where like reference numerals refer to like elements throughout.

DETAILED DESCRIPTION OF THE INVENTION

In the following description, for purposes of explanation and not limitation, specific details are set forth such as particular embodiments, circuits, circuit components, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention with unnecessary detail.

For purposes of the present invention, the term "amplifier circuit" is defined to refer to any type of electronic device used to generate an output signal at a power level sufficient for transmission over a transmission medium. Such an amplifier circuit may include a line driver for use in a digital subscriber line environment, a radio frequency power amplifier for use in a radio environment, as well as other types of signal drivers. In order to simplify the detailed description of the invention, however, reference is often made to the non-limiting example of a line driver with the understanding that the invention may be readily applied to any type of amplifier circuit.

As described earlier, the present invention includes an amplifier circuit, a first power supply capable of generating power at a first level, a second power supply capable of generating power at a second level greater than the first level, and a controller causing power to be supplied (1) from the first power supply to the amplifier circuit when a magnitude of the input signal is less than or equal to the threshold and (2) from the second power supply to the amplifier circuit when a magnitude of the input signal is greater than the threshold.

Figure 1:
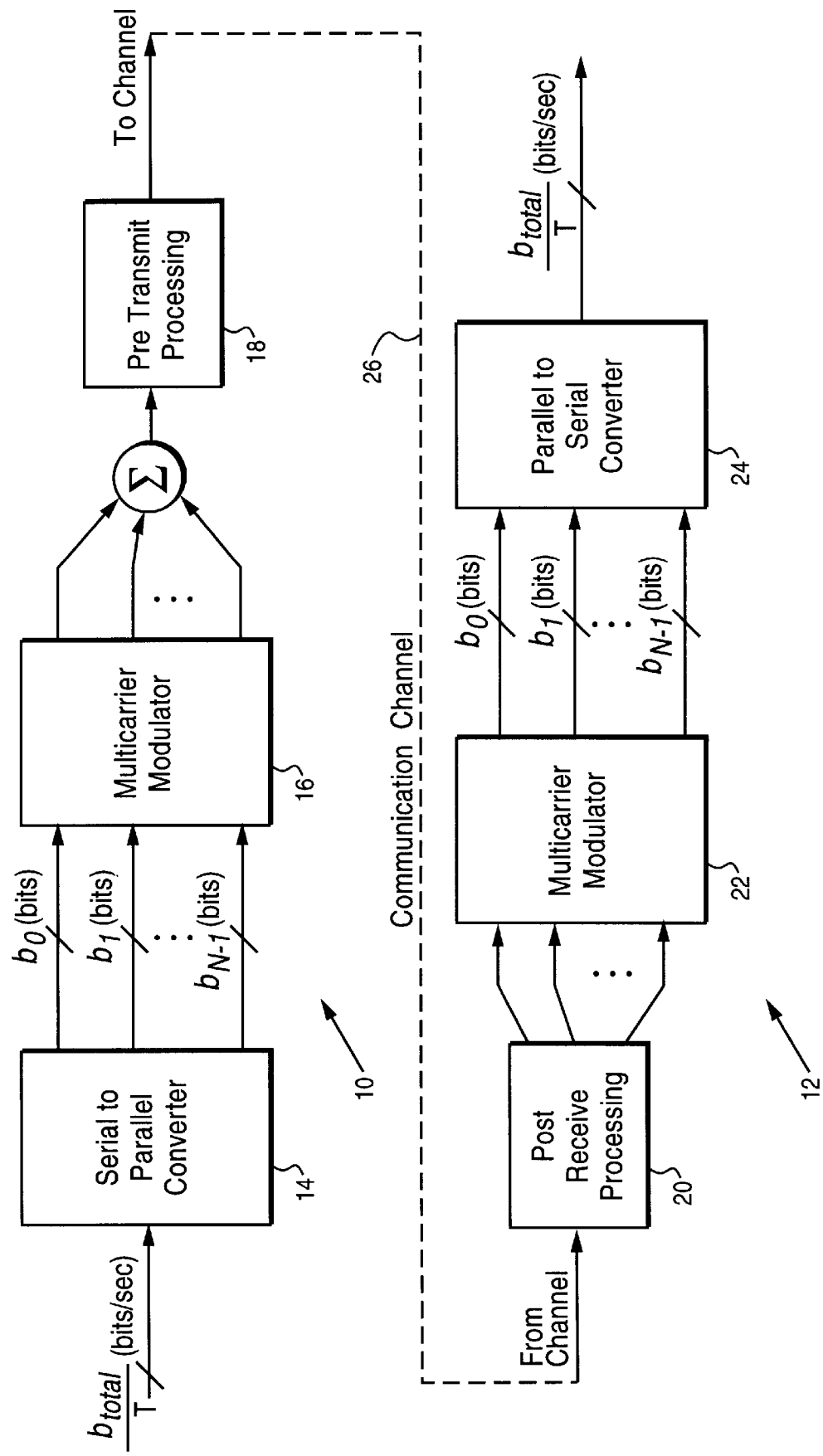
FIG. 1 is a function block diagram showing an example discrete multi-tone (DMT) system in which the present invention may be employed.
Figure 2:
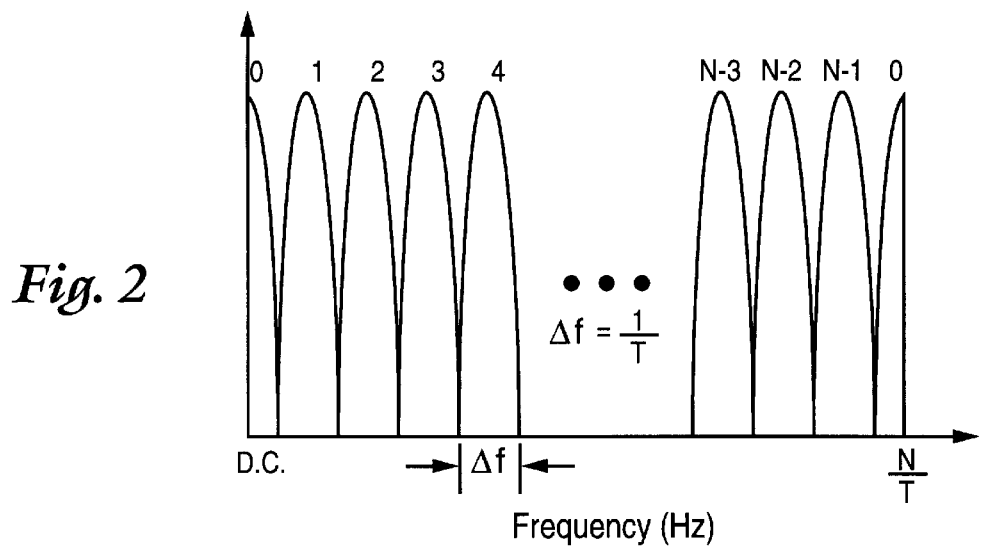
FIG. 2 is a graph illustrating the principle of a multi-carrier system.
Figure 3:
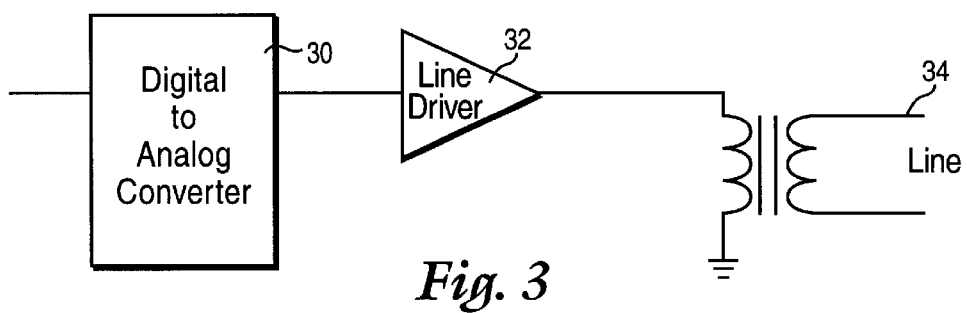
FIG. 3 is a simplified illustration of a line driver in a digital subscriber line environment.
Figure 4:
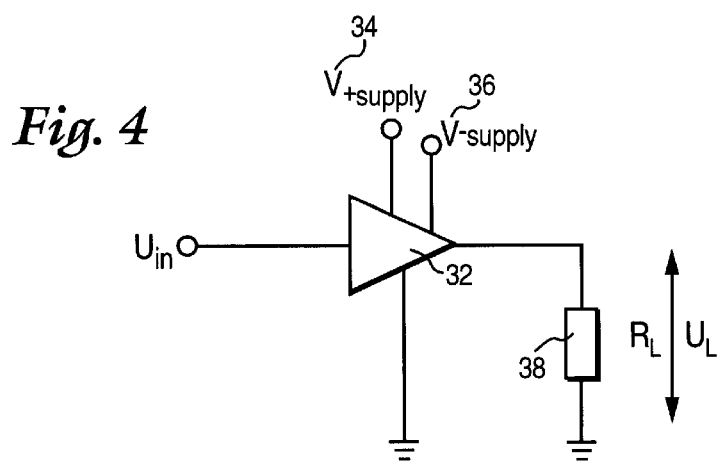
FIG. 4 is a simplified diagram of an amplifier circuit that may be employed as a line driver, a power amplifier, etc.
Figure 5:
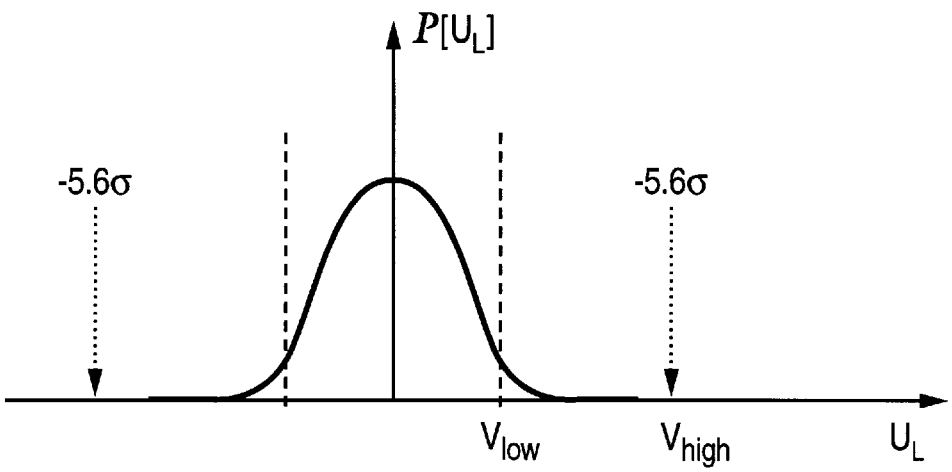
FIG. 5 is a graph showing a normal distribution of multi-carrier modulator output signals.
Figure 6:
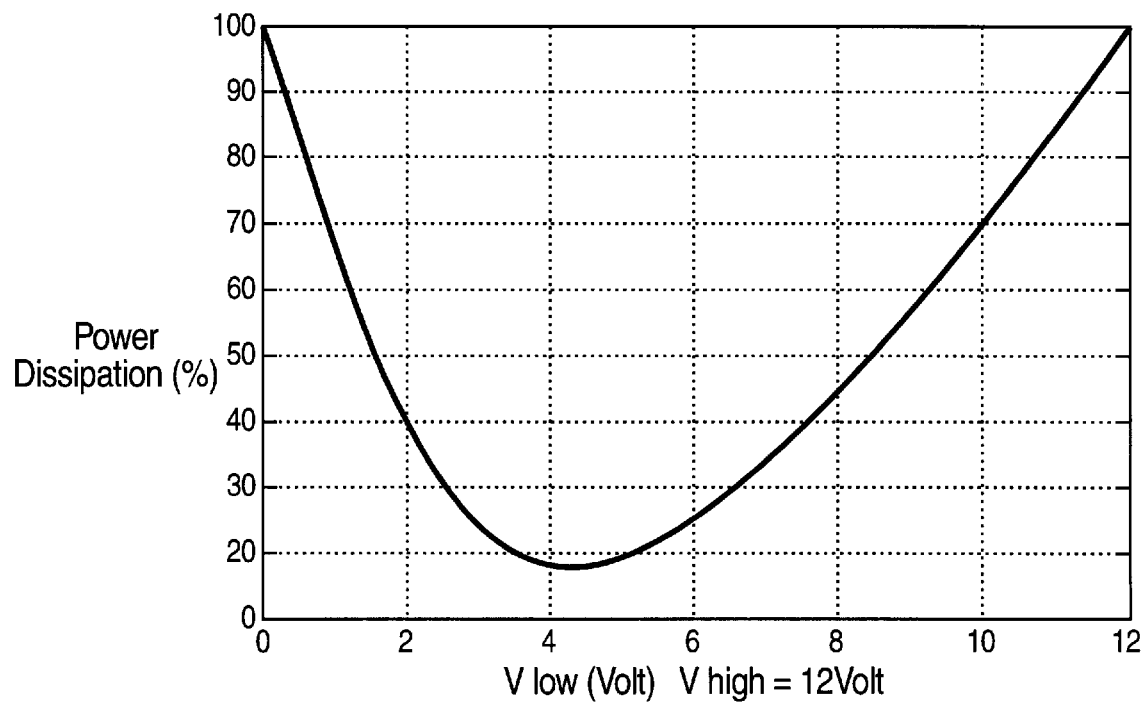
FIG. 6 is a graph plotting a lower supply voltage (in volts) against power dissipation (in %) assuming a fixed high supply voltage in accordance with the present invention.

Assuming two different power supplies are used in an example implementation, suitable values need to be determined for the first and second power levels. It would be preferable to use, if possible, power supplies commonly manufactured and/or employed in the electronics, computer, and communications industries. One such power supply level is a 12 volt power supply. Accordingly, the twelve volt supply may be used as the second, relatively high but infrequently employed power supply level. Using equation (1) set forth above, FIG. 6 plots the reduction of power dissipation in a line driver circuit for the normal output signal distribution shown in FIG. 5 as a function of X assuming a high supply voltage of 12 volts. The graph shows that if the power supply value is the same voltage as the high value, i.e., 12 volts, there is no reduction in power dissipation. As the lower power supply voltage level decreases from 12 volts, the line driver power dissipation decreases. As can be seen in FIG. 6, the lowest power dissipation is achieved at approximately 4.5 volts. A very common power supply voltage close to 4.5 volts is 5 volts.

Thus, in a preferred example embodiment, the first, frequently used power supply generates power at a 5 volt level, and the second, infrequently used power supply generates power at 12 volts. In the example shown in FIGS. 5 and 6, this particular selection of off-the-shelf power supplies employed in one preferred, example configuration of the invention permits reduction of line driver power dissipation by 80 percent.

Figure 7:
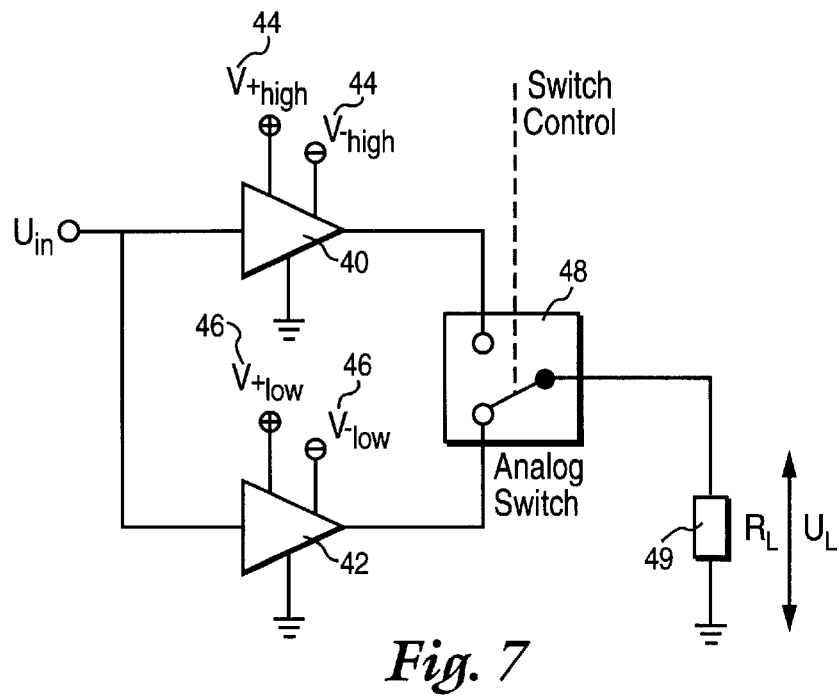
FIG. 7 is a diagram showing a first example embodiment of the present invention.

A first example embodiment for implementing the present invention is shown in FIG. 7. An input voltage is provided to an amplifier circuit which includes first and second amplifiers 40 and 42, respectively. First amplifier 40 is supplied by a relatively high magnitude power supply 44 having both positive and negative polarity supply rails. The second amplifier 42 is connected to a relatively low magnitude power supply 46 having positive and negative supply rails. The use of positive and negative supply rails is common in electronic circuits. However, the present invention is not limited to any particular power supply configuration and could for example be applied to a single power supply that produces voltage at plural levels or power supplies that produce voltage at a single polarity.

The outputs of the amplifiers 40 and 42 are coupled through an analog switch 48 to a load 49 represented for example as a resistive load $R_L$. The switch 48 is preferably a low resistance analog switch. In operation, a switch control signal is provided to selectively actuate the analog switch 48 to couple the output of the first amplifier 40 to the load 49 when the magnitude of the input signal $U_{in}$, exceeds a threshold, and to couple the output of the second amplifier 42 having the lower supply voltage 46 to the load 49 when the input signal $U_{in}$, is less than or equal to the threshold.

Figure 8:
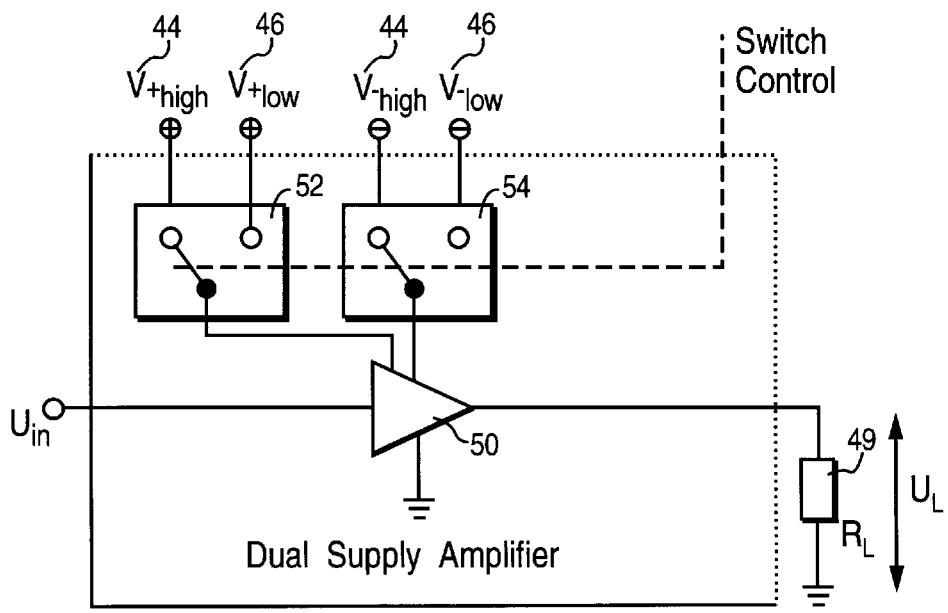
FIG. 8 is a diagram showing a second example embodiment of the present invention.

An alternative example embodiment for implementing the present invention is shown in FIG. 8. In this example embodiment, a single amplifier 50 is shown switchably connectable to both the high power supply 44 and the low power supply 46. Again, in this example, each power supply includes positive and negative polarity voltage rails, i.e., $V_{high}^+, V_{high}^-$, and $V_{low}^+, V_{low}^-$. Two switches 52 and 54 selectively couple power to the amplifier 50 from one of the power supplies 44 and 46. Preferably, the amplifier 50 has a high supply voltage rejection ratio so that the voltage output $U_L$ is unaffected by the operation of the switches 52 and 54.

In operation, a switch control signal actuates the switches 52 and 54 to select the positive and negative high voltage supply rails $V_{high}^+$ and $V_{low}^-$ when the input signal $U_{in}$ exceeds a threshold. When the voltage input is less than or equal to the threshold, the switch control signal actuates switches 52 and 54 to connect the dual supply amplifier 50 to the positive and negative low voltage supply rails $V_{high}^+$ and $V_{low}^-$.

Figure 9:
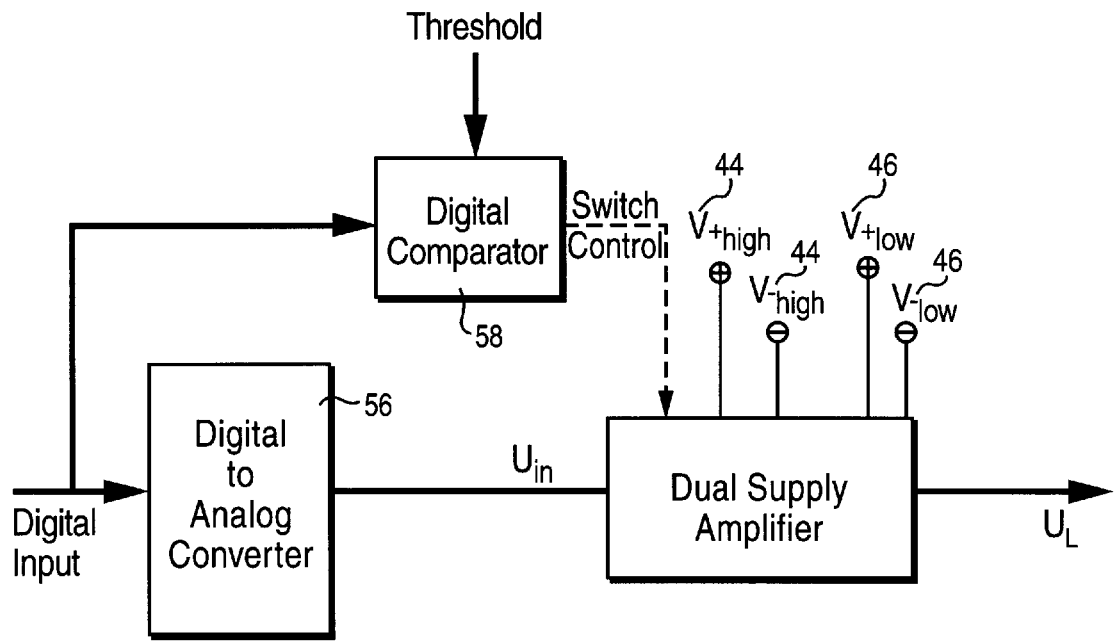
FIG. 9 shows a digital implementation of a switch control signal that may be employed in the present invention.
Figure 10:
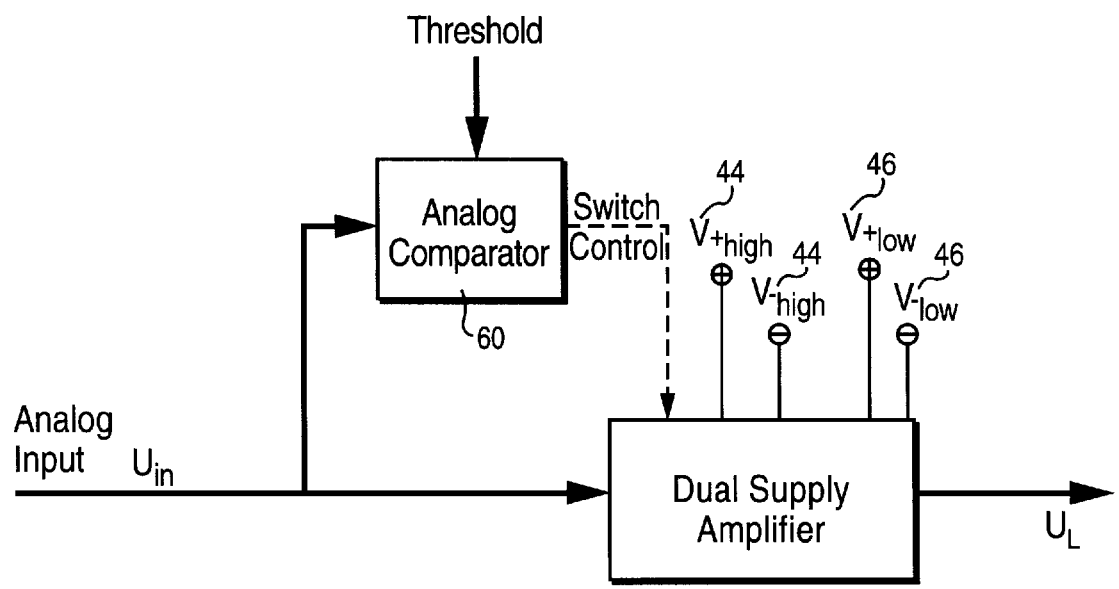
FIG. 10 shows an analog implementation for generating a switch control signal for use in the present invention.

FIGS. 9 and 10 show example configurations for generating the switch control signal for the dual power supply amplifier shown in FIG. 8. In FIG. 9, a digital signal input to the digital-to-analog converter 56 is also supplied to a digital comparator 58. The digital comparator 58 compares the input digital value to a digital threshold. Based on the comparison, the digital comparator generates the switch control signal fed to the dual power supply amplifier. Alternatively in FIG. 10, the analog input $U_{in}$, is fed to an analog comparator 60 for comparison to an analog threshold value in order to generate the switch control signal supplied to the dual power supply amplifier. Although discrete comparators are shown, the threshold comparison operation may also be performed using a software or other electronic implementation.

Figure 11:
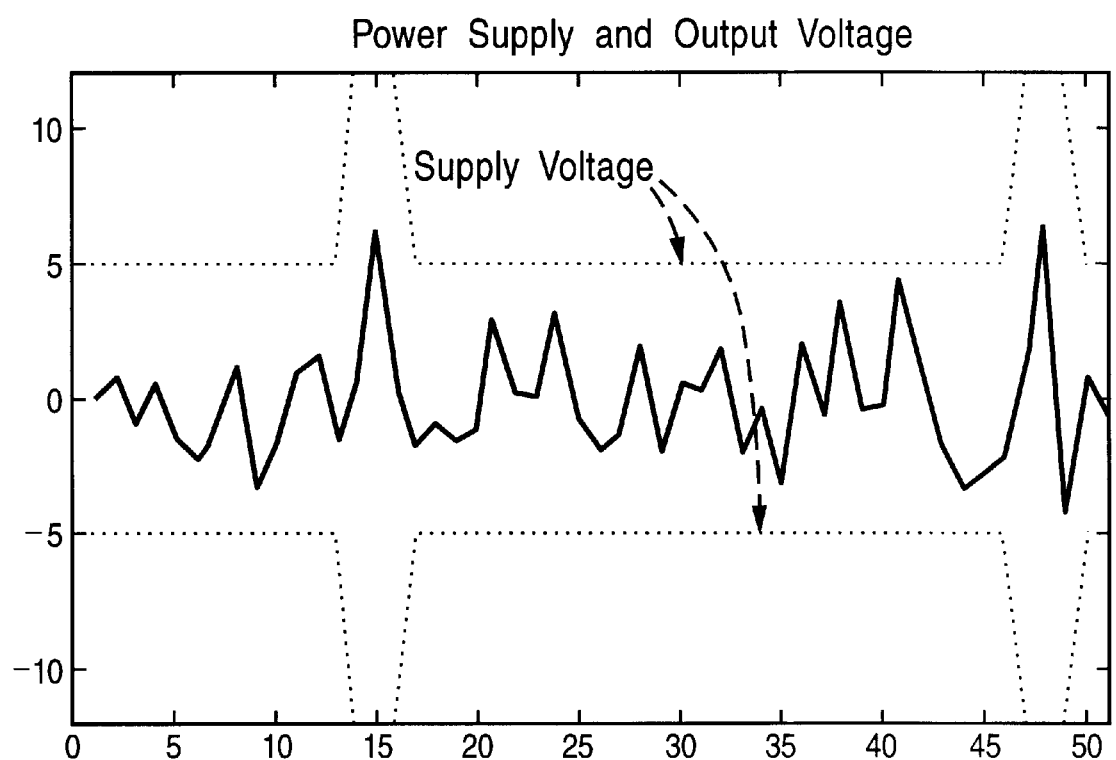
FIG. 11 is a graph showing the amplifier circuit supply voltage plotted with the output voltage of the amplifier circuit in accordance with the present invention.

FIG. 11 graphically illustrates the operation of the present invention. The solid line represents the output voltage, and the dashed line represents the power supply voltage. Example instances are shown where the input signal is sufficiently large to exceed the threshold so that the higher supply voltage, in this example 12 volts, is momentarily substituted for the normally used lower supply voltage of 5 volts.

Thus the present invention effectively and efficiently reduces the power dissipated in an amplifier driver circuit by changing the power supply to the amplifier circuit depending on the level of an input signal. The higher power is supplied to the amplifier circuit (which may include one or more amplifiers) when the level of the input signal exceeds a threshold. Otherwise, a lower power is supplied. In some systems such as multi-carrier modulation-based systems, this savings in power dissipation can be considerable.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A multi-carrier, line driving device for use in a digital subscriber line environment, comprising:
    a digital-to-analog converter receiving a digital input signal and converting the digital input signal into an analog input signal;
    an amplifier circuit, coupled to the digital-to-analog converter, receiving the analog input signal and generating an analog output signal;
    a first power supply capable of generating power at a first level;
    a second power supply capable of generating power at a second level greater than the first level; and
    a digital comparator comparing the digital input signal to a threshold, and as a result of the comparison, causing power to be supplied from the first power supply to the amplifier circuit when a magnitude of the digital input signal is less than a threshold and from the second power supply to the amplifier circuit when a magnitude of the digital input signal is greater than or equal to the threshold.

2. The multi-carrier, line driving device in claim 1, wherein the amplifier circuit includes a single amplifier having a power input, the apparatus further comprising:
    a switch coupled to the first and second power supplies and to the power input of the amplifier circuit,
    the digital comparator generating a control signal controlling the switch to selectively couple either of the first and second power supplies to the power input of the single amplifier.

3. The multi-carrier, line driving device in claim 1, wherein the first level corresponds to a voltage of five volts and the second level corresponds to a voltage of twelve volts.

4. The multi-carrier, line driving device in claim 1, wherein the first power supply supplies to the amplifier circuit a first voltage magnitude at positive and negative polarities and the second power supply supplies the amplifier a second voltage magnitude at positive and negative polarities.

5. The multi-carrier, line driving device in claim 1, wherein the first level corresponds to a voltage of five volts and the second level corresponds to a voltage of twelve volts.

6. Apparatus comprising:
    an amplifier circuit receiving an input signal and generating an output signal;
    a first power supply capable of generating power at a first level;
    a second power supply capable of generating power at a second level greater than the first level; and
    a controller causing power to be supplied from the first power supply to the amplifier circuit when a magnitude of the input signal is less than a threshold and from the second power supply to the amplifier circuit when a magnitude of the input signal is greater than or equal to the threshold,
    wherein the amplifier circuit includes first and second amplifiers each coupled to the input signal, the first amplifier coupled to the first power supply and the second amplifier coupled to the second power supply, the apparatus further comprising:
    a switch coupled to an output from each of the first and second amplifiers, the controller generating a control signal controlling the switch to select the output from either of the first and second amplifiers.

7. Apparatus comprising:
- a first amplifier receiving an input signal and generating a first output signal;
- a second amplifier receiving the input signal and generating a second output signal;
- a first power supply supplying power at a first level to the first amplifier;
- a second power supply supplying power at a second level greater than the first level to the second amplifier;
- a switch coupled to the outputs of the first and second amplifiers; and
- a controller generates a control signal controlling the switch to select the first output when a magnitude of the input signal is less than a threshold and to select the second output when the magnitude of the input signal is greater than or equal to the threshold.

8. The apparatus in claim 7, wherein the first and second amplifiers are line drivers selectively used in a multi-carrier transmission system.

9. The apparatus in claim 7, wherein the first level corresponds to a voltage of five volts and the second level corresponds to a voltage of twelve volts.

10. The apparatus in claim 7, wherein the first power supply supplies to the first amplifier a first voltage magnitude at positive and negative polarities and the second power supply supplies the amplifier a second voltage magnitude at positive and negative polarities.

11. The apparatus in claim 7, wherein the controller includes a comparator which compares an amplitude of the input signal with the threshold and generates the control signal based on the comparison.

12. A method of changing the power supplied to an amplifier circuit depending on the level of an input signal to the amplifier circuit such that a high power is supplied to the amplifier circuit when the level of the input signal exceeds a threshold and otherwise a lower power is supplied including:
- detecting the magnitude of the input signal;
- comparing the detected magnitude with the threshold; and
- generating a control signal based on the comparison,
- wherein the amplifier circuit contains first and second amplifiers connected to the input signal, a first power supply connected to the first amplifier, a second power supply generating power greater than the first power supply connected to the second amplifier, and a switch coupled to the output of each of the first and second amplifiers, wherein the control signal causes the switch to select the output from one of the first and second amplifiers.

* * * * *